(12) United States Patent
Kwon et al.

(10) Patent No.: US 7,825,468 B2
(45) Date of Patent: Nov. 2, 2010

(54) SEMICONDUCTOR PACKAGES, STACKED SEMICONDUCTOR PACKAGES, AND METHODS OF MANUFACTURING THE SEMICONDUCTOR PACKAGES AND THE STACKED SEMICONDUCTOR PACKAGES

(75) Inventors: Yong-Chai Kwon, Suwon-si (KR); Dong-Ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 12/003,544

(22) Filed: Dec. 28, 2007

(65) Prior Publication Data
US 2008/0157394 A1 Jul. 3, 2008

(30) Foreign Application Priority Data
Dec. 29, 2006 (KR) .................... 10-2006-0137859

(51) Int. Cl.
  *H01L 29/76* (2006.01)
  *H01L 29/94* (2006.01)
  *H01L 31/062* (2006.01)
  *H01L 31/113* (2006.01)
  *H01L 23/04* (2006.01)
  *H01L 23/48* (2006.01)
(52) U.S. Cl. .................. 257/343; 257/689; 257/777; 257/E21.001; 257/E23.141
(58) Field of Classification Search .......... 257/343, 257/689, 777, E21.001, E23.141
See application file for complete search history.

(56) References Cited

U.S. PATENT DOCUMENTS 5,153,986 A     10/1992   Brauer et al.
7,127,301 B1 *  10/2006   Okandan et al. ............ 607/116
2005/0224952 A1 10/2005  Vindasius et al.
2006/0055050 A1 * 3/2006 Numata et al. .............. 257/774
2006/0131721 A1 6/2006   Ito

FOREIGN PATENT DOCUMENTS

| JP | 2002-050738 | 2/2002 |
| JP | 2004-228392 | 8/2004 |
| JP | 2004-288722 | 10/2004 |
| KR | 10-2006-0051152 A | 5/2006 |

OTHER PUBLICATIONS

Korean Patent Office Action dated Jan. 15, 2008, for Korean Patent Application No. 10-2006-0137859 (3 pp.).

* cited by examiner

*Primary Examiner*—David S Blum
(74) *Attorney, Agent, or Firm*—Harness, Dickey & Pierce, P.L.C.

(57) ABSTRACT

A semiconductor package may include a semiconductor pattern, a bonding pad, and a polymer insulation member. The semiconductor pattern may include a semiconductor device and first hole. The bonding pad may include a wiring pattern and plug. The wiring pattern may be formed on an upper face of the semiconductor pattern. The plug may extend from the wiring pattern to fill the first hole. The polymer insulation member may be formed on a lower face of the semiconductor pattern and may include a second hole exposing a lower end of the plug. A method of manufacturing a semiconductor package may include forming a first hole through a semiconductor substrate; forming a bonding pad and plug; attaching a supporting member to the upper face of the substrate; reducing a thickness of the substrate; forming a polymer insulation member on the lower face of the substrate; and cutting the substrate.

10 Claims, 7 Drawing Sheets

SEMICONDUCTOR PACKAGES, STACKED SEMICONDUCTOR PACKAGES, AND METHODS OF MANUFACTURING THE SEMICONDUCTOR PACKAGES AND THE STACKED SEMICONDUCTOR PACKAGES

PRIORITY STATEMENT

This application claims priority from Korean Patent Application No. 2006-0137859, filed on Dec. 29, 2006, in the Korean Intellectual Property Office (KIPO), the entire contents of which are incorporated herein by reference.

BACKGROUND

1. Field

Example embodiments relate to semiconductor packages, stacked semiconductor packages, and methods of manufacturing the semiconductor packages and the stacked semiconductor packages. Also, example embodiments relate to semiconductor packages including semiconductor devices, stacked semiconductor packages including the semiconductor devices, and methods of manufacturing the semiconductor packages and the stacked semiconductor packages including the semiconductor devices.

2. Description of Related Art

Generally, various semiconductor processes are carried out on a semiconductor substrate to form a plurality of semiconductor devices. To mount the semiconductor device on a motherboard, a packaging process is performed on the semiconductor substrate. According to a conventional packaging process, the semiconductor substrate is cut along a scribe lane to divide the semiconductor substrate into a plurality of semiconductor chips including semiconductor devices. Each of the semiconductor chips is attached to a circuit substrate. A bonding pad of the semiconductor chip and the circuit substrate are electrically connected to each other using a conductive wire. A mold is formed on the circuit substrate to cover the semiconductor chip with the mold. Outer terminals such as solder balls are mounted to the circuit substrate.

However, since the conventional packaging process is separately carried out on each of the semiconductor chips, the conventional packaging process may have a low efficiency.

To overcome the above-mentioned problem, a wafer level packaging process has recently been proposed. In the wafer level packaging process, before cutting a semiconductor substrate, a packaging process is carried out on the whole semiconductor substrate. The packaged semiconductor substrate is then cut to form a plurality of semiconductor packages.

Examples of conventional wafer level packaging processes are disclosed in Japanese Patent Laid-Open Publication Nos. 2002-050738 A, 2004-288722 A, and 2004-228392 A, etc.

According to the method in Japanese Patent Laid-Open Publication No. 2002-050738 A, a hole is formed through a semiconductor chip. An insulation layer is formed on an inner face of the hole. Wafer level packages are then stacked using the insulation layer as an adhesive.

According to the method in Japanese Patent Laid-Open Publication No. 2004-288722 A, holes are formed through a semiconductor chip. The holes are then filled with plugs. A supporting member is attached to an upper face of the semiconductor chip. A lower portion of the semiconductor chip is partially removed to expose the plugs. The exposed plugs are connected to each other to stack wafer level packages.

According to the method in Japanese Patent Laid-Open Publication No. 2004-228392 A, a hole is formed through a semiconductor chip. An electrode is then plated on an inner face of the hole. A supporting member is attached on an upper face of the semiconductor chip using an adhesive. A lower portion of the semiconductor chip is partially removed to expose the electrode.

However, in the above-mentioned conventional methods, when the lower portion of the semiconductor chip is removed, a lower face of the semiconductor chip as well as the plug may be partially exposed. This may cause a short circuit between a semiconductor substrate of an upper package and a plug of a lower package.

To prevent the short circuit between the semiconductor substrate and the plug, an insulation layer including silicon or photoresist may be formed on a lower face of the semiconductor substrate. However, since the insulation layer may be formed at a temperature of no less than about 100° C., the supporting member for supporting the semiconductor substrate may be detached from the semiconductor substrate due to thermal decomposition of the supporting member before a sawing process.

SUMMARY

Example embodiments may provide semiconductor packages that include a polymer insulation member for preventing a lower face of a semiconductor substrate from being exposed, and/or a structure or structures for preventing a supporting member from being detached from the semiconductor substrate in forming the polymer insulation member.

Example embodiments also may provide stacked semiconductor packages that have a structure or structures in which the above-mentioned semiconductor packages are stacked.

Example embodiments still also may provide methods of manufacturing the above-mentioned semiconductor packages and/or stacked semiconductor packages.

According to example embodiments, a semiconductor package may include a semiconductor pattern, a bonding pad, and/or a polymer insulation member. The semiconductor pattern may include a semiconductor device and/or a first hole. The bonding pad may include a wiring pattern and/or a plug. The wiring pattern may be formed on an upper face of the semiconductor pattern. The wiring pattern may be electrically connected to the semiconductor device. The plug may extend from the wiring pattern to at least substantially fill the first hole. The polymer insulation member may be formed on a lower face of the semiconductor pattern. The polymer insulation member may include a second hole. The second hole may expose a lower end of the plug.

According to example embodiments, stacked semiconductor package may include a first semiconductor package and a second semiconductor package. The first semiconductor package may include a first semiconductor pattern, a first bonding pad, and a first polymer insulation member. The first semiconductor pattern may include a first semiconductor device and/or a first hole. The first bonding pad may include a first wiring pattern and/or a first plug. The first wiring pattern may be formed on an upper face of the first semiconductor pattern. The first wiring pattern may be electrically connected to the first semiconductor device. The first plug may extend from the first wiring pattern to at least substantially fill the first hole. The first polymer insulation member may be formed on a lower face of the first semiconductor pattern. The first polymer insulation member may include a second hole. The second hole may expose a lower end of the first plug. The second semiconductor package may include a second semiconductor pattern, a second bonding pad, and/or a second polymer insulation member. The second semiconductor pattern may include a second semiconductor device and/or a third hole. The second bonding pad may include a second wiring pattern and a second plug. The second wiring pattern may be formed on an upper face of the second semiconductor pattern. The second wiring pattern may be electrically connected to the second semiconductor device. The second plug may extend from the second wiring pattern to at least substantially fill the third hole. The second polymer insulation member may be formed on a lower face of the second semiconductor pattern. The second polymer insulation member may include a fourth hole. The fourth hole may expose a lower end of the second plug.

According to example embodiments, a method of manufacturing a semiconductor package may include: forming a first hole through a semiconductor substrate that includes a plurality of semiconductor devices; forming a bonding pad, that includes a wiring pattern formed on an upper face of the semiconductor substrate adapted to be electrically connected to each of the semiconductor devices, and a plug, extending from the wiring pattern to at least substantially fill the first hole; attaching a supporting member to the upper face of the semiconductor substrate using an adhesive member; reducing a thickness of the semiconductor substrate to expose a lower end of the plug from a lower face of the semiconductor substrate: forming a polymer insulation member, that includes a second hole for exposing the lower end of the plug, on the lower face of the semiconductor substrate at a temperature that allows or temperatures that allow the supporting member not to be thermally decomposed; and cutting the semiconductor substrate along a scribe lane.

According to example embodiments, a method of manufacturing a stacked semiconductor package may include: forming a first hole through a semiconductor substrate that includes a plurality of semiconductor devices; forming a bonding pad, that includes a wiring pattern formed on an upper face of the semiconductor substrate adapted to be electrically connected to each of the semiconductor devices, and a plug, extending from the wiring pattern to at least substantially fill the first hole; attaching a supporting member to the upper face of the semiconductor substrate using an adhesive member; reducing a thickness of the semiconductor substrate to expose a lower end of the plug from a lower face of the semiconductor substrate; forming a polymer insulation member, that includes a second hole for exposing the lower end of the plug, on the lower face of the semiconductor substrate at a temperature that allows or temperatures that allow the supporting member to be not thermally decomposed; cutting the semiconductor substrate along a scribe lane to form a plurality of semiconductor packages; removing the supporting member from the semiconductor packages: and/or stacking the semiconductor packages using the polymer insulation member between the stacked semiconductor packages to connect the wiring patterns of the semiconductor packages to the plugs of corresponding semiconductor packages.

BRIEF DESCRIPTION OF THE DRAWINGS

The above and/or other aspects and advantages will become more apparent and more readily appreciated from the following detailed description of example embodiments taken in conjunction with the accompanying drawings, in which.

DESCRIPTION OF EXAMPLE EMBODIMENTS

Figure 1:
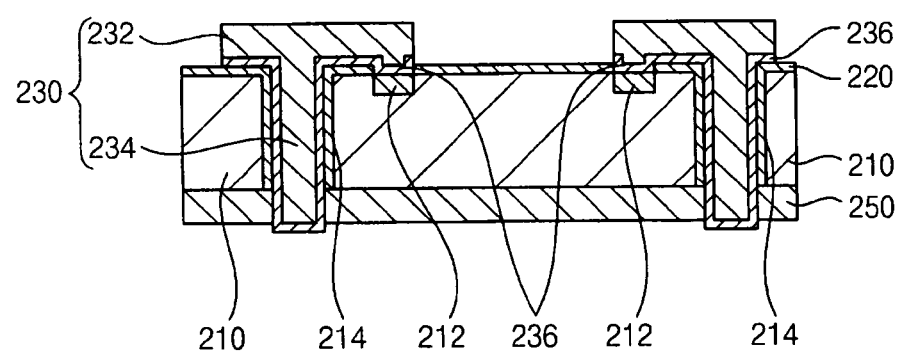
FIG. 1 is a cross-sectional view illustrating a semiconductor package according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element or layer is referred to as being "on," "connected to," "electrically connected to," or "coupled to" another component, it may be directly on, connected to, electrically connected to, or coupled to the other component or intervening components may be present. In contrast, when an element is referred to as being "directly on," "directly connected to," "directly electrically connected to," or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view illustrating a semiconductor package according to example embodiments.

Referring to FIG. 1, semiconductor package 200 according to example embodiments may include semiconductor pattern 210 having a semiconductor device (not shown) and/or a first hole 214, an insulation layer pattern 220 formed on an upper face of the semiconductor pattern 210 and/or an inner wall of first hole 214, a bonding pad 230 electrically connected to a contact pad 212 of the semiconductor device, and/or a polymer insulation member 250 formed on a lower face of the semiconductor pattern 210. For example, the bonding pad 230 may have a wiring structure including a wiring pattern and/or a plug. Further, the semiconductor pattern 210 may correspond to a semiconductor chip.

The contact pad 212 may be included in the semiconductor device. The contact pad 212 may be formed on the upper face of the semiconductor pattern 210. Further, the contact pad 212 may be exposed through the insulation layer pattern 220. According to example embodiments, the insulation layer pattern 220 on the inner wall of the first hole 214 in the semiconductor pattern 210 may insulate the contact pad 212 from the bonding pad 230. For example, the insulation layer pattern 220 may include a material substantially the same as that of the polymer insulation member 250.

The bonding pad 230 may include a wiring pattern 232, electrically connected to the contact pad 212, and/or the plug 234, formed in the first hole 214. Thus, the insulation layer pattern 220 may electrically an insulate plug 234 from the semiconductor device. According to example embodiments, the plug 234 may have a lower end protruded from the lower face of the semiconductor pattern 210. Further, a metal barrier layer 236 may be formed between the insulation layer pattern 220 and the bonding pad 230. The metal barrier layer 236 may be thin relative to the wiring pattern 232 and/or the plug 234.

Additionally, a conductive adhesive layer (not shown) may be formed on the wiring pattern 232. For example, when the semiconductor packages 200 are stacked, the conductive adhesive layer may assist an electrical connection and/or reinforce adhesion strength between the semiconductor packages 200.

The polymer insulation member 250 may include para-xylene polymer. The polymer insulation member 250 may be formed on the lower face of the semiconductor pattern 210 to insulate the semiconductor pattern 210 from a bonding pad of an adjacent semiconductor pattern during a stacking process. According to example embodiments, the polymer insulation member 250 may be formed on the lower face of the semiconductor pattern 210. In addition or in the alternative, the polymer insulation member 250 may have a second hole (not shown) for exposing the lower end of the plug 234 of the bonding pad 230. Furthermore, the polymer insulation member 250 may have a thickness substantially equal to or less than a protruded length of the plug 234 from the semiconductor pattern 210.

For example, the polymer insulation member 250 may be formed at a temperature or temperatures no greater than about 40° C. The polymer insulation member 250 may include para-xylene. Thus, an adhesive member (not shown) of a supporting member (not shown) used for manufacturing the semiconductor pattern 210 may not be thermally decomposed. As a result, the supporting member may not be detached from the semiconductor pattern 210 during the manufacture of the semiconductor package 200. Further, since the polymer insulation member 250 may prevent the lower face of the semiconductor pattern 210 from being exposed, a short circuit between the semiconductor pattern 210 and the plug 234 may be prevented.

The polymer insulation member 250 having one or more of the above-mentioned functions may include para-xylene polymer, which may be represented by the following first chemical formula. The polymer insulation member 250 may be formed, for example, by polymerizing xylene monomer on the lower face of the semiconductor pattern 210 at a temperature or temperatures greater than or equal to about 10° C. and less than or equal to about 40° C. That is, the polymer insulation member 250 may include the para-xylene polymer represented by the first chemical formula below, wherein n denotes a natural number.

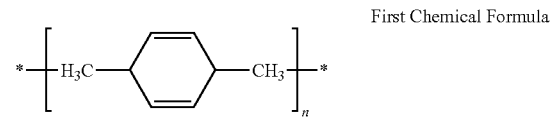

First Chemical Formula

Examples of the xylene monomer may include para-xylene monomer, chloro para-xylene monomer, dichloro para-xylene monomer, perfluoro para-xylene monomer. etc. Further, an organosilane layer for improving adhesion strength of the polymer insulation member 250 may be additionally formed on the lower face of the semiconductor pattern 210.

FIGS. 2 to 9 are cross-sectional views illustrating a method of manufacturing the semiconductor package of FIG. 1.

Figure 2:
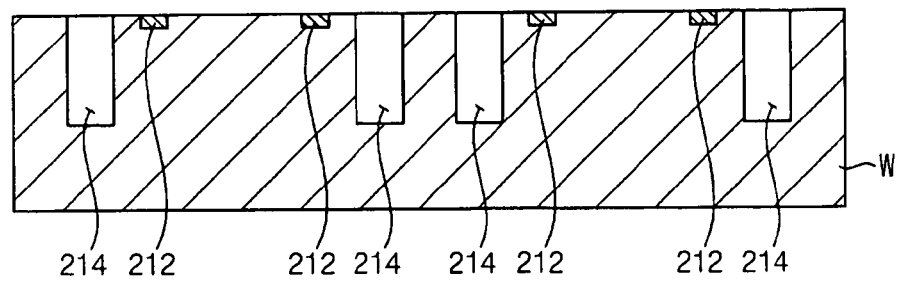
FIGS. 2 to 9 are cross-sectional views illustrating a method of manufacturing the semiconductor package of FIG. 1.

Referring to FIG. 2, a semiconductor substrate W including silicon on which a plurality of semiconductor devices (not shown) is formed may be prepared. Each of the semiconductor devices may have contact pads 212 exposed through an upper face of the semiconductor substrate W.

A first hole 214 may then be formed from the upper face of the semiconductor substrate W including the semiconductor devices. According to example embodiments, the first hole 214 may have, for example, a depth less than a thickness of the semiconductor substrate W. Thus, the first hole 214 may not be formed all the way through the semiconductor substrate W. For example, when four semiconductor devices are formed on the semiconductor substrate W, the number of the first holes 214 may be four.

Figure 3:
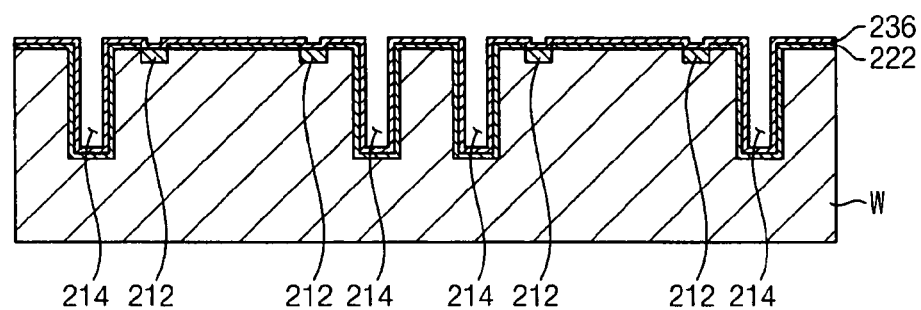

Referring to FIG. 3, an insulation layer 222 having a substantially uniform thickness may be formed on the upper face of the semiconductor substrate W and/or the inner wall of the first hole 214. After forming the insulation layer 222, a metal barrier layer 236 having a substantially uniform thickness may be formed on the insulation layer 222. According to example embodiments, the insulation layer 222 may be formed by a deposition process at a low temperature, for example, using the xylene monomer.

Figure 4:
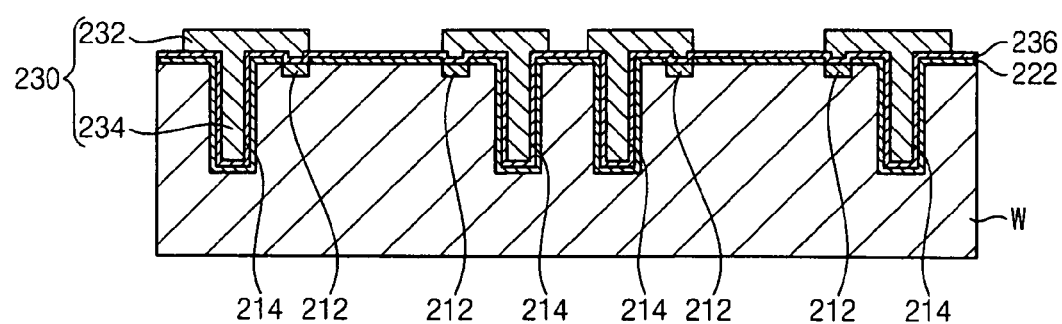

Referring to FIG. 4, bonding pads 230 may be formed on the metal barrier layer 236. According to example embodiments, a photoresist pattern (not shown) for partially exposing the metal barrier layer 236 may be formed on the metal barrier layer 236. A plating process may then be carried out on the exposed portions of the metal barrier layer 236 to form the bonding pad 230. For example, the bonding pad 230 may include a wiring pattern 232 arranged over the semiconductor substrate W to be electrically connected to the contact pad 212, and/or the plug 234 formed in the first hole 214 to be electrically connected to the wiring, pattern 232. Further, after forming the bonding pad 230, a conductive adhesive layer (not shown) may be formed on the wiring pattern 232.

The photoresist pattern may then be removed by an etching process and/or a stripping process.

Figure 5:
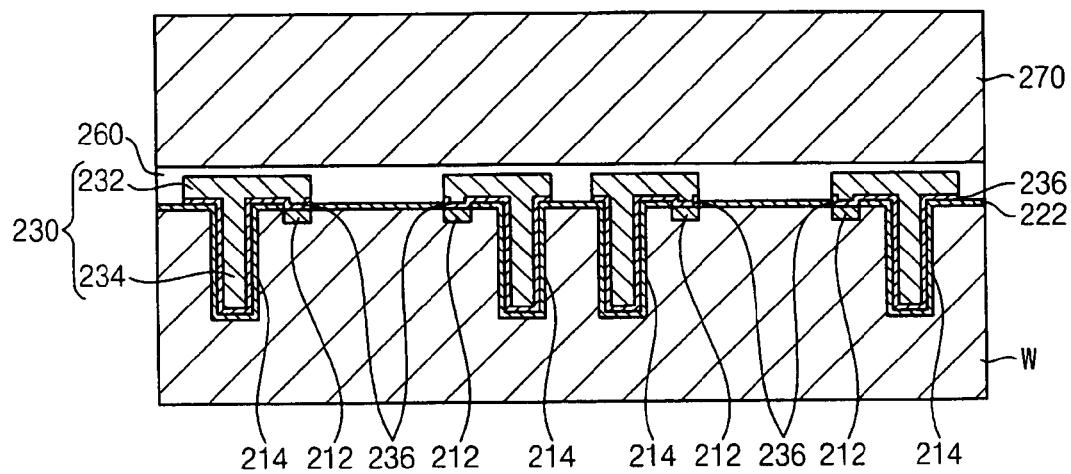

Referring to FIG. 5, the metal barrier layer 236 may be etched using the bonding pad 230 as an etching mask.

A supporting member 270 may then be attached to the upper face of the semiconductor substrate W using the adhesive member 260. For example, the adhesive member 260 may have a thermal expansion coefficient substantially the same as that of the semiconductor substrate W including silicon. Thus, the adhesive member 260 may suppress damage of the semiconductor substrate W during following processes. Particular functions of the adhesive member 260 will be illustrated with illustrations of the following processes.

According to example embodiments, the supporting member 270 having one or more of the above-mentioned function may include glass. Further, since the supporting member 270 may be removed in the following processes, the adhesive member 260 may include a material having low adhesion strength when the material is exposed to heat or ultraviolet (UV) ray. Examples of the adhesive member 260 may include thermoplastic tape, UV-sensitive tape, thermoplastic paste, UV-sensitive paste, spin-on resin, etc.

Figure 6:
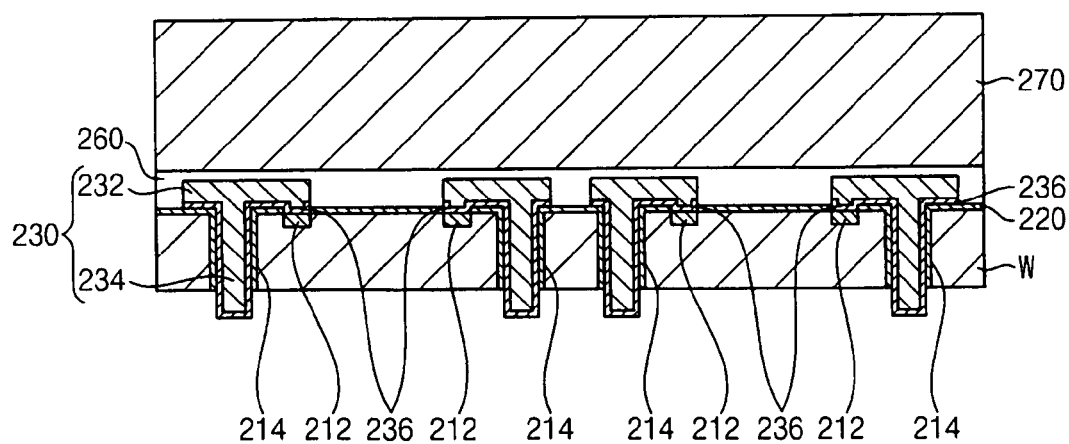

Referring to FIG. 6, the semiconductor substrate W may be thinned to protrude the lower end of the plug 234 from the lower face of the semiconductor substrate W. Thus, the insulation layer 222 may be converted into the insulation layer pattern 220 having the second hole (not shown) that exposes the lower end of the plug 234.

According to example embodiments, to protrude the lower end of the plug 234, the lower face of the semiconductor substrate W and/or the lower end of the plug 234 may be polished. The polished lower face of the semiconductor substrate W may be then etched to protrude the polished lower end of the plug 234 from the etched lower face of the semiconductor substrate W. For example, the lower face of the semiconductor substrate W may be carried out by a wet etching process using an etching solution that has a high etching selectivity with respect to the semiconductor substrate W including the silicon compared to the plug 234, and/or by a dry etching process with respect to the semiconductor substrate W including the silicon. Further, the insulation layer 222 on the lower end of the plug 234 may be removed.

Alternatively, the lower face of the semiconductor substrate W may be polished until the lower end of the plug 234 is exposed. The polished lower face of the semiconductor substrate W may be etched to protrude the lower end of the plug 234 from the etched lower face of the semiconductor substrate W. For example, the lower face of the semiconductor substrate W may be carried out by a wet etching process using an etching solution that has a high etching selectivity with respect to the semiconductor substrate W including the silicon compared to the plug 234.

For example, the polishing process with respect to the lower face of the semiconductor substrate W may be carried out under conditions that the semiconductor substrate W is reversed. Thus, the supporting member 270 may upwardly support the semiconductor substrate W so that the semiconductor substrate W may be firmly supported during the polishing process. As a result, damage to the semiconductor substrate W in the polishing process may be limited.

Figure 7:
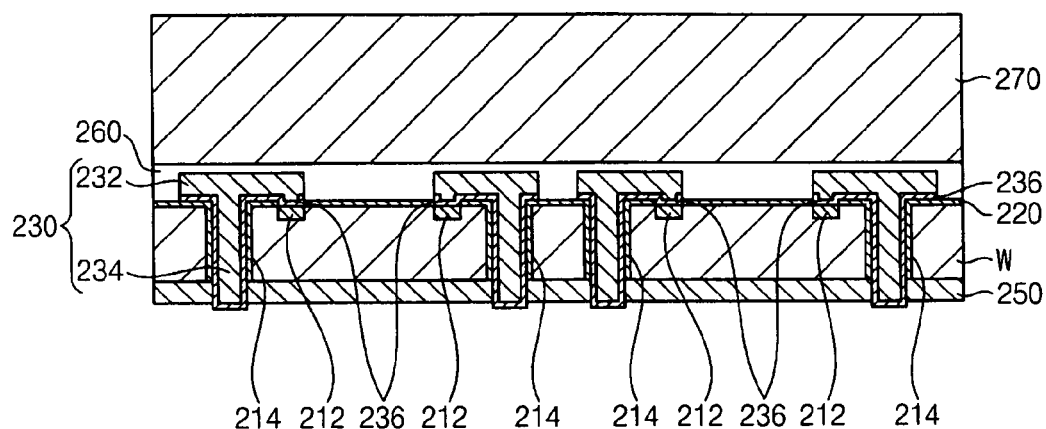

Referring to FIG. 7, the polymer insulation member 250 may be formed on the lower face of the semiconductor substrate W. The polymer insulation member 250 may have a hole for exposing the lower end of the plug 234. The polymer insulation member 250 may include para-xylene.

According to example embodiments, the polymer insulation member 250 may be formed by evaporating xylene dimonomer, and by thermally decomposing the evaporated xylene dimonomer to form xylene monomer. For example, the xylene dimonomer may be decomposed at a temperature or temperatures greater than or equal to about 550° C. and less than or equal to about 700° C.

Examples of the xylene monomer may include para-xylene monomer, chloro para-xylene monomer, dichloro para-xylene monomer, perfluoro para-xylene monomer, etc. The para-xylene monomer, for example, may be represented by the following second chemical formula. The chloro para-xylene monomer, for example, may be represented by the following third chemical formula. The dichloro para-xylene monomer, for example, may be represented by the following fourth chemical formula. The perfluoro para-xylene monomer, for example, may be represented by the following fifth chemical formula.

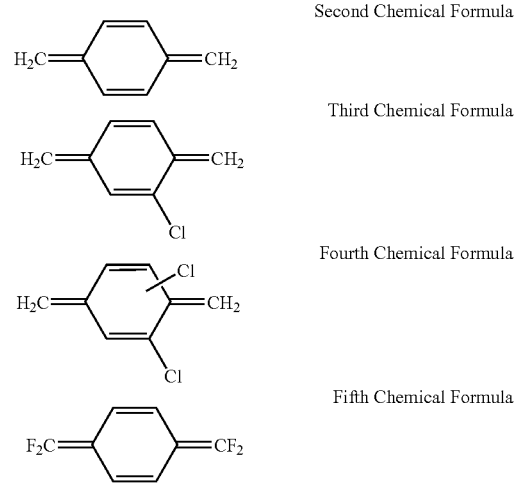

Second Chemical Formula

Third Chemical Formula

Fourth Chemical Formula

Fifth Chemical Formula

The xylene monomer may be deposited on the lower face of the semiconductor substrate W to form a polymer insulation layer in which the para-xylene monomer is polymerized. The polymer insulation layer may then be patterned to form polymer insulation member 250 having the second hole, which exposes the lower end of the plug 234, on the lower face of the semiconductor substrate W. According to example embodiments, the polymer insulation member 250 may be represented by the following sixth chemical formula, wherein n denotes a natural number.

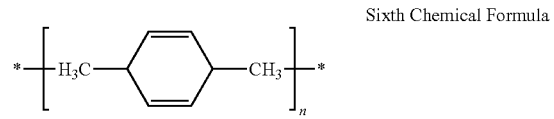

Sixth Chemical Formula

For example, the polymer insulation member 250 may be formed at a temperature or temperatures greater than or equal to about 10° C. and less than or equal to about 40° C. so that the adhesive member 260 of the supporting member 270 used for forming the semiconductor pattern 210 may not be thermally decomposed. Thus, supporting member 270 may not be detached from the semiconductor pattern 210 during manufacture of the semiconductor package 200. Further, since the polymer insulation member 250 may prevent the lower face of the semiconductor pattern 210 from being exposed, the short circuit between the semiconductor pattern 210 and/or the plug 234 may be prevented during the stacking process.

Further, an organosilane layer for improving adhesion strength of the polymer insulation member 250 may be additionally formed on the lower face of the semiconductor pattern 210.

Figure 8:
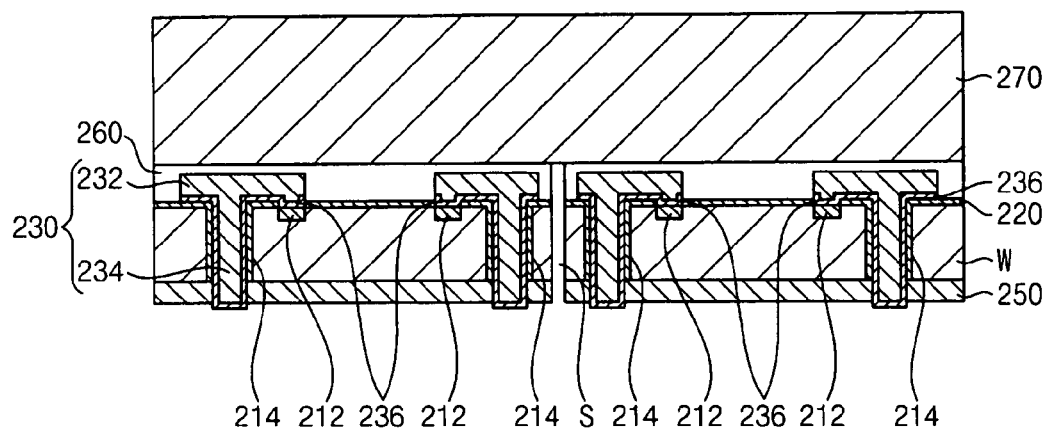

Referring to FIG. 8, the semiconductor substrate W may be cut along scribe lane S to divide the semiconductor substrate W into the semiconductor packages including the semiconductor pattern 210. For example, the semiconductor packages may be connected to each other through the supporting member 270. Thus, since the supporting member 270 may firmly support the semiconductor substrate W during the cutting process, the semiconductor substrate W may not be damaged. Particularly, since the supporting member 270 may support the semiconductor substrate W, an additional process for attaching a sawing tape to the semiconductor substrate W may not be required in example embodiments. Further, after the cutting process, a process for removing the sawing tape may not be needed.

Figure 9:
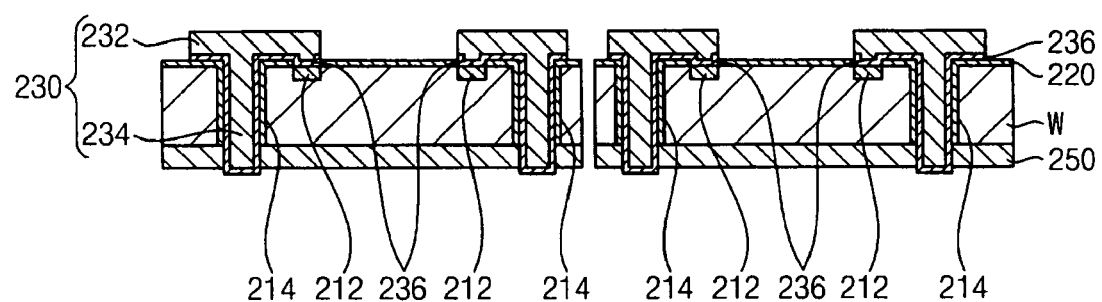

Referring to FIG. 9, heat or UV ray may be irradiated to the adhesive member 260 to remove the supporting member 270 from the semiconductor packages 200, thereby completing the separation of the semiconductor packages 200 from the supporting member 270.

Figure 10:
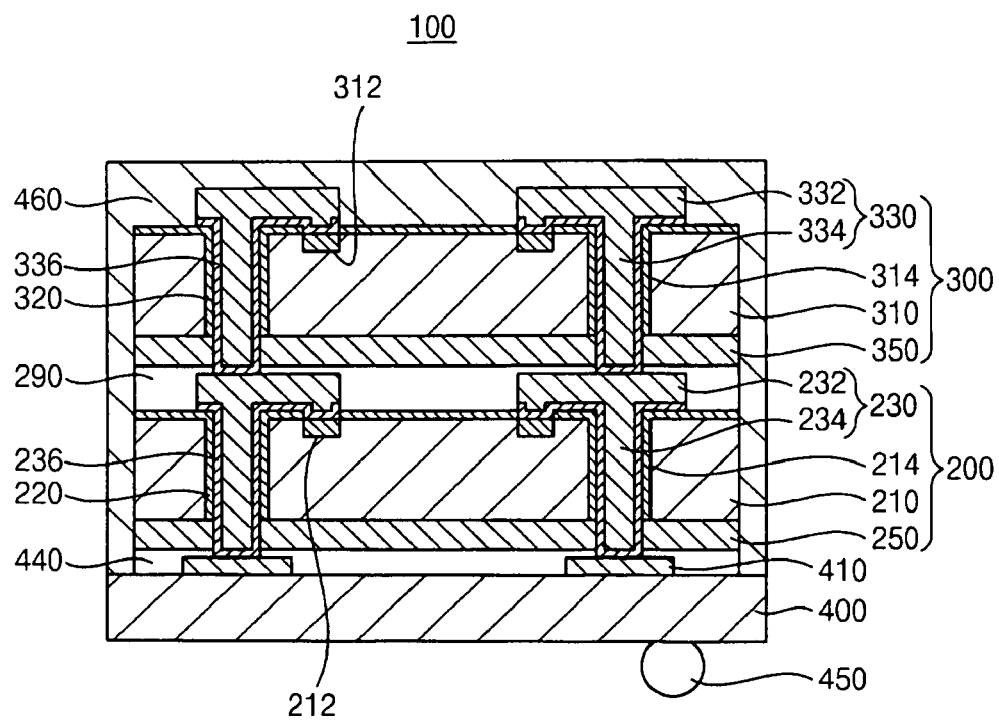
FIG. 10 is a cross-sectional view illustrating a stacked semiconductor package according to example embodiments.

FIG. 10 is a cross-sectional view illustrating a stacked semiconductor package according to example embodiments.

Referring to FIG. 10, a stacked semiconductor package 100 according to example embodiments may include a printed circuit board (PCB) 400, a first semiconductor package 200 mounted on the PCB 400, and/or a second semiconductor package 300 mounted on the first semiconductor package 200.

The first semiconductor package 200 may include a first semiconductor pattern 210 having a first semiconductor device (not shown) and/or a first hole 214, a first insulation layer pattern 220 formed on an upper face of the first semiconductor pattern 210 and/or an inner wall of the first hole 214, a first bonding pad 230 electrically connected to a first contact pad 212 of the first semiconductor device, and/or a first polymer insulation member 250 formed on a lower face of the first semiconductor pattern 210. For example, the first semiconductor pattern 210 may correspond to a first semiconductor chip.

The first contact pad 212 may be included in the first semiconductor device. The first contact pad 212 may be formed on the upper face of the first semiconductor pattern 210. Further, the first contact pad 212 may be exposed through the first insulation layer pattern 220. According to example embodiments, the first insulation layer pattern 220 on the inner wall of the first hole 214 in the first semiconductor pattern 210 may insulate the first contact pad 212 from the first bonding pad 230.

The first bonding pad 230 may include a first wiring pattern 232 electrically connected to the first contact pad 212, and/or a first plug 234 formed in the first hole 214. Thus, the first insulation layer pattern 220 may electrically insulate the first plug 234 from the first semiconductor device. According to example embodiments, the first plug 234 may halve a lower end protruded from the lower face of the first semiconductor pattern 210. Further, a first metal barrier layer 236 may be formed between the first insulation layer pattern 220 and the first bonding pad 230. The metal barrier layer 236 may be thin relative to the wiring pattern 232 and/or the plug 234.

Additionally, a first conductive adhesive layer (not shown) may be formed on the first wiring pattern 232. For example, when the first semiconductor package 200 and the second semiconductor package 300 may be stacked, the first conductive adhesive layer may assist an electrical connection and/or also reinforce adhesion strength between the first semiconductor package 200 and the second semiconductor package 300.

The first polymer insulation member 250 may include para-xylene polymer. The first polymer insulation member 250 may be formed on the lower face of the first semiconductor pattern 210, in order to insulate the first semiconductor pattern 210 from the PCB 400 and/or the electrode pad 410 during a stacking process. According to example embodiments, the first polymer insulation member 250 may have a second hole (not shown) for exposing the lower end of the first plug 234. Furthermore, the first polymer insulation member 250 may have a thickness substantially equal to or less than a protruded length of the first plug 234 from the first semiconductor pattern 210.

For example, the first polymer insulation member 250 may be formed by polymerizing xylene monomer on the lower face of the first semiconductor pattern 210 at a temperature or temperatures no greater than about 40° C. Thus, an adhesive member (not shown) of a supporting member (not shown) used for manufacturing the first semiconductor pattern 210 may not be thermally decomposed. Further, since the first polymer insulation member 250 may prevent the lower face of the first semiconductor pattern 210 from being exposed, a short circuit between the first semiconductor pattern 210 and the PCB 400 and/or the electrode pad 410 may be prevented. According to example embodiments, the first polymer insulation member 250 may have a thickness substantially equal to or less than the protruded length of the first plug 234 from the first semiconductor pattern 210. Further, an organosilane layer (not shown) may be formed between the first polymer insulation member 250 and the first semiconductor pattern 210.

The lower end of the first plug 234 may be mounted to the electrode pad 410 of the PCB 400. Further, to ensure electrical contact between the electrode pad 410 and the first plug 234, a conductive adhesive layer (not shown) may be formed on the electrode pad 410. Additionally, a filling member 440 having an adhesion function may be formed between the first polymer insulation member 250 and the PCB 400. Outer terminals 450, such as a solder ball, may be mounted to a lower face of the PCB 400. The outer terminals 450 may be electrically connected to the electrode pad 410. According to example embodiments, a hole (not shown) may be formed through the PCB 400. The hole may be filled with a conductive member (not shown) to electrically connect the outer terminals 450 to the electrode pad 410 via the conductive member.

The second semiconductor package 300 may include elements substantially the same as those of the first semiconductor package 200. That is, the second semiconductor package 300 may include a second semiconductor pattern 310 having a second semiconductor device (not shown) and/or a third hole 314, a second insulation layer pattern 320 formed on an upper face of the second semiconductor pattern 310 and/or an inner wall of the third hole 314, a second bonding pad 330 electrically connected to a second contact pad 312 of the second semiconductor device, and/or a second polymer insulation member 350 formed on a lower face of the second semiconductor pattern 310. For example, the second semiconductor pattern 310 may correspond to a second semiconductor chip. Further, a second metal barrier layer 336 may be formed between the second insulation layer pattern 320 and the second bonding pad 330. The metal barrier layer 336 may be thin relative to the wiring pattern 332 and/or the plug 334.

The second bonding pad 330 may include a second wiring pattern 332 electrically connected to the second contact pad 312, and the second plug 334 formed in the third hole 314. The second plug 334 may have a lower end electrically connected to the first wiring pattern 232 of the first semiconductor package 200. According to example embodiments, the lower end of the second plug 334 may be electrically connected to a first conductive adhesive layer (not shown) of the first semiconductor package 200. The second polymer insulation member 350 may have a fourth hole (not shown) for exposing the lower end of the second plug 334. For example, the second polymer insulation member 350 may be substantially the same as first the polymer insulation member 250. Thus, any further illustrations with respect to the second polymer insulation member 350 are omitted herein for brevity. Additionally, a second filling member 290, having adhesion function between the first semiconductor package 200 and the second semiconductor package 300, may be formed between the second polymer insulation member 350 and the wiring pattern 232 and/or the insulation layer pattern 220.

Further, a mold 460 for protecting the first semiconductor package 200 and/or the second semiconductor package 300 from outer impacts may cover the first semiconductor package 200 and/or the second semiconductor package 300.

According to example embodiments, a structure having the first semiconductor package 200 and the second semiconductor package 300 sequentially stacked is exemplarily explained. Additionally, at least one semiconductor package including elements that are substantially the same as those of the first semiconductor package 200 and/or the second semiconductor package 300 may be stacked on the second semiconductor package 300. According to example embodiments, the PCB 400 may have the outer terminals 450. In addition or in the alternative, the outer terminals 450 may be directly formed on the lower end of the first plug 234 and/or the metal barrier layer 236. Thus, the PCB 400 may not be required in the stacked semiconductor package 100 having the above-mentioned structure.

Figure 11:
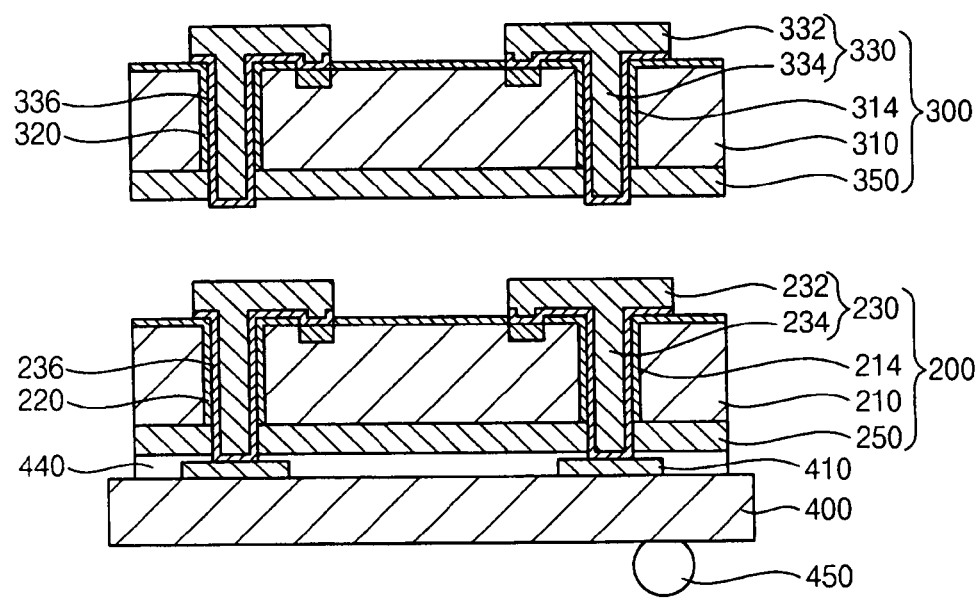
FIGS. 11 and 12 are cross-sectional views illustrating a method of manufacturing the stacked semiconductor package of FIG. 10.
Figure 12:
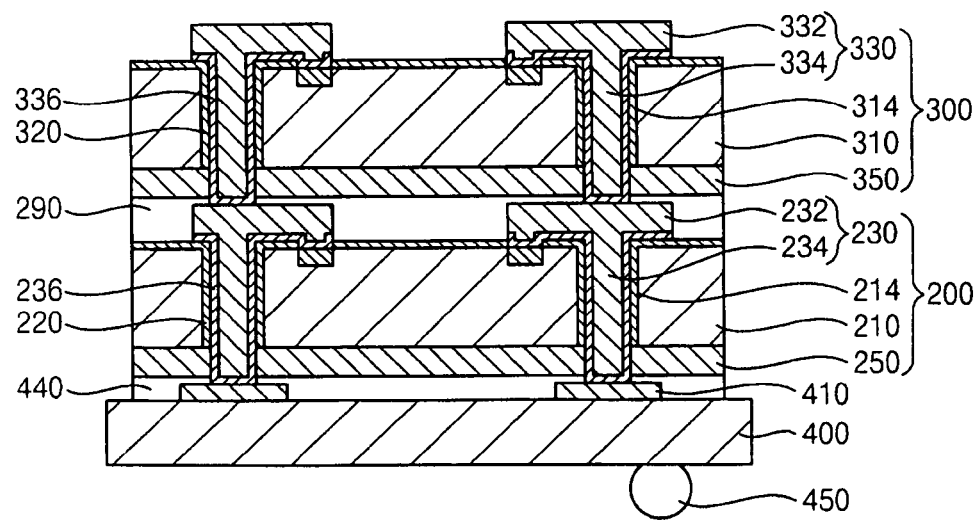

FIGS. 11 and 12 are cross-sectional views illustrating a method of manufacturing the stacked semiconductor package 100 in FIG. 10.

The first semiconductor package 200 and/or the second semiconductor package 300 may be manufactured in the substantially same manner as the process explained with reference to FIGS. 2 to 9. Thus, the same reference numerals will be used to refer the same elements and explanations will be given to the process that follows FIG. 9.

Referring to FIG. 11, the processes illustrated with reference to FIGS. 2 to 9 may be carried out to form the first semiconductor package 200 and/or the second semiconductor package 300.

The lower end of the first plug 234 in the first semiconductor package 200 may be mounted to the electrode pad 410 of the PCB 400. According to example embodiments, the first semiconductor package 200 may be firmly attached to the PCB 400 using the first filling member 440.

Referring to FIG. 12, the lower end of the second plug 334 in the second semiconductor package 300 may be mounted to the first wiring pattern 234 of the first semiconductor package 200. According to example embodiments, a second filling member 290 may be formed between the first semiconductor package 200 and the second semiconductor package 300. Therefore, the first semiconductor package 200 and the second semiconductor package 300 may be firmly attached to each other using the second filling member 290.

The first semiconductor package 200 and/or the second semiconductor package 300 may be covered with the mold 460 to complete s the tacked semiconductor package 100 in FIG. 10.

Figure 13:
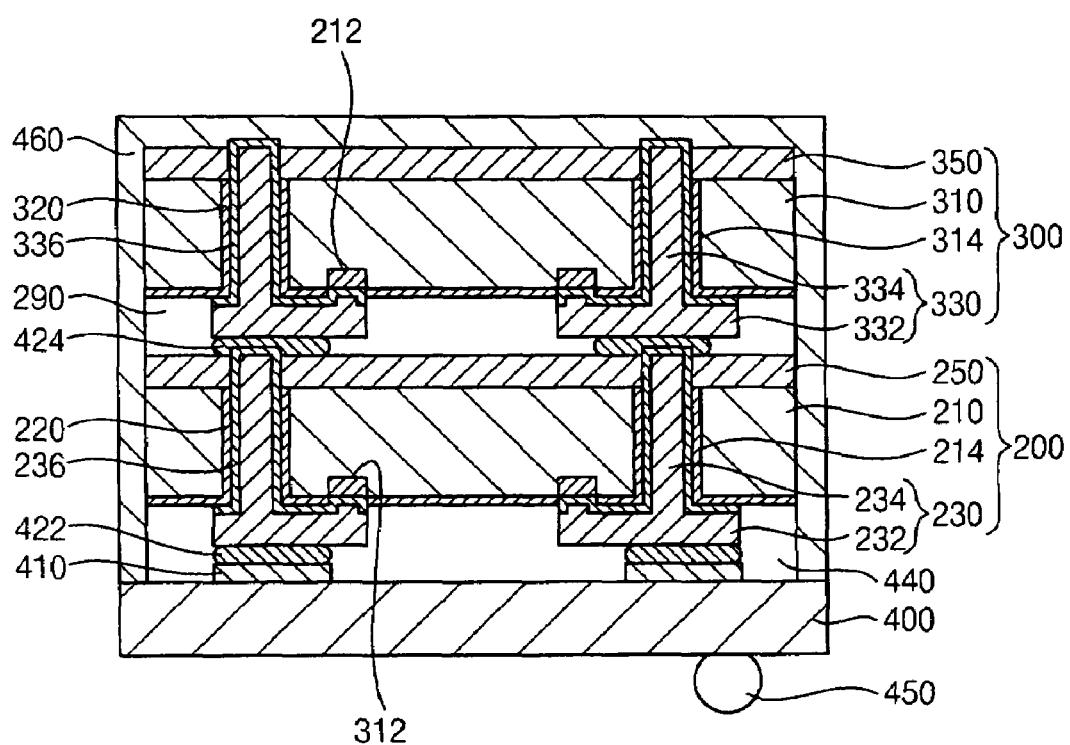
FIG. 13 is a cross-sectional view illustrating a stacked semiconductor package according to example embodiments.

FIG. 13 is a cross-sectional view illustrating a stacked semiconductor package according to example embodiments.

Referring to FIG. 13, a stacked semiconductor package of example embodiments may include a printed circuit board (PCB) 400, a first semiconductor package 200 mounted on the PCB 400, and/or a second semiconductor package 300 mounted on the first semiconductor package 200.

The first semiconductor package 200 may include a first semiconductor pattern 210 having a first semiconductor device (not shown) and/or a first hole 214, a first insulation layer pattern 220 formed on an upper face of the first semiconductor pattern 210 and/or an inner wall of the first hole 214, a first bonding pad 230 electrically connected to a first contact pad 212 of the first semiconductor device, and a first polymer insulation member 250 formed on a lower face of the first semiconductor pattern 210. For example, the first semiconductor pattern 210 may correspond to a first semiconductor chip.

According to example embodiments, the first wiring pattern 232 of the first bonding pad 230 in the first semiconductor package 200 may be electrically connected to an electrode pad 410 of the PCB 400. The first wiring pattern 232 may be electrically connected to the electrode pad 410 through a first bump 422. For example, the first semiconductor package 200 is previously illustrated in detail with reference to FIG. 10. Thus, any further illustrations with respect to the first semiconductor package 200 are omitted herein for brevity.

The second semiconductor package 300 may include elements substantially the same as those of the first semiconductor package 200. That is, the second semiconductor package 300 may include the second semiconductor pattern 310 having a second semiconductor device (not shown) and/or the third hole 314, the second insulation layer pattern 320 formed on an upper face of the second semiconductor pattern 310 and/or an inner wall of the third hole 314, the second bonding pad 330 electrically connected to the second contact pad 312 of the second semiconductor device, and/or the second polymer insulation member 350 formed on a lower face of the second semiconductor pattern 310. For example, the second semiconductor pattern 310 may correspond to a second semiconductor chip.

According to example embodiments, the second wiring pattern 332 of the second bonding pad 330 in the second semiconductor package 300 may be electrically connected to the first plug 234 of the first semiconductor package 200. The second wiring pattern 332 may be electrically connected to the first plug 234 via a second bump 424. For example, the second semiconductor package 300 is previously illustrated in detail with reference to FIG. 10. Thus, any further illustrations with respect to the second semiconductor package 300 are omitted herein for brevity.

Further, the mold 460 for protecting the first semiconductor package 200 and/or the second semiconductor package 300 from outer impacts may cover the first semiconductor package 200 and/or the second semiconductor package 300.

According to example embodiments, a structure having the first semiconductor package 200 and the second semiconductor package 300 sequentially stacked is exemplarily explained. Additionally, at least one semiconductor package including elements that are substantially the same as those of the first semiconductor package 200 and/or the second semiconductor package 300 may be stacked on the second semiconductor package 300. According to example embodiments, the PCB 400 has the outer terminals 450. In addition or in the alternative, the outer terminals 450 may be directly formed on the lower end of the first wiring pattern 232 and/or the first plug 234. Thus, the PCB 400 may not be required in the stacked semiconductor package 100 having the above-mentioned structure.

According to the present invention, the polymer insulation member on the lower face of the semiconductor chip may be formed at a temperature or temperatures no greater than about 40° C. so that the adhesive member of the supporting member used for forming the insulation member may not be thermally decomposed. Thus, the supporting member may not be detached from the semiconductor chip. Further, thermal stresses applied to the semiconductor chip may be suppressed. Furthermore, since the polymer insulation member covers the lower face of the semiconductor chip to prevent the lower face of the semiconductor chip from being exposed, a short circuit between the semiconductor chip and the plug may be prevented.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor package, comprising:
a semiconductor pattern;
an insulation layer pattern;
a bonding pad; and
a polymer insulation member;
wherein the semiconductor pattern includes a semiconductor device and a first hole,
wherein the bonding pad includes a wiring pattern and a plug,
wherein the insulation layer pattern is on an inner surface of the first hole and an upper surface of the semiconductor pattern,
wherein the wiring pattern is on an upper surface of the semiconductor pattern,
wherein the wiring pattern is electrically connected to the semiconductor device,
wherein the plug extends from the wiring pattern to at least substantially fill the first hole,
wherein the polymer insulation member is on a lower face of the semiconductor pattern,
wherein the polymer insulation member includes a second hole, and
wherein the second hole exposes a lower end of the plug.

2. The semiconductor package of claim 1, further comprising:
a conductive adhesive layer on the semiconductor pattern.

3. The semiconductor package of claim 1, further comprising:
an organosilane layer adapted to improve adhesion strength of the polymer insulation member to the semiconductor pattern.

4. The semiconductor package of claim 1, wherein the polymer insulation member comprises para-xylene polymer.

5. The semiconductor package of claim 1, wherein the polymer insulation member is formed by polymerizing one or more of para-xylene monomer, chloro para-xylene monomer, dichloro para-xylene monomer, and perfluoro para-xylene monomer at a temperature or temperatures greater than or equal to about 10° C. and less than or equal to about 40° C.

6. A stacked semiconductor package, comprising:
a first semiconductor package; and
a second semiconductor package;
wherein the first semiconductor package includes:
a first semiconductor pattern;
a first insulation layer pattern;
a first bonding pad; and
a first polymer insulation member;
wherein the first semiconductor pattern includes a first semiconductor device and a first hole,
wherein the first bonding pad includes a first wiring pattern and a first plug,
wherein the first insulation layer pattern is on an inner surface of the first hole and an upper surface of the first semiconductor pattern,
wherein the first wiring pattern is on an upper surface of the first semiconductor pattern,
wherein the first wiring pattern is electrically connected to the first semiconductor device,
wherein the first plug extends from the first wiring pattern to at least substantially fill the first hole,
wherein the first polymer insulation member is on a lower face of the first semiconductor pattern,
wherein the first polymer insulation member includes a second hole, and
wherein the second hole exposes a lower end of the first plug,
wherein the second semiconductor package includes:
a second semiconductor pattern;
a second bonding pad; and
a second polymer insulation member;
wherein the second semiconductor pattern includes a second semiconductor device and a third hole,
wherein the second bonding pad includes a second wiring pattern and a second plug,
wherein the second wiring pattern is on an upper face of the second semiconductor pattern,
wherein the second wiring pattern is electrically connected to the second semiconductor device,
wherein the second plug extends from the second wiring pattern to at least substantially fill the third hole,
wherein the second polymer insulation member is on a lower face of the second semiconductor pattern,
wherein the second polymer insulation member includes a fourth hole, and
wherein the fourth hole exposes a lower end of the second plug.

7. The stacked semiconductor package of claim 6, further comprising:
a filling member;
wherein the filling member is between the first semiconductor package and the second semiconductor package.

8. The stacked semiconductor package of claim 6, wherein the polymer insulation member comprises para-xylene polymer.

9. The stacked semiconductor package of claim 6, wherein the polymer insulation member is formed by polymerizing one or more of para-xylene monomer, chloro para-xylene monomer, dichloro para-xylene monomer, and perfluoro para-xylene monomer at a temperature or temperatures greater than or equal to about 10° C. and less than or equal to about 40° C.

10. The stacked semiconductor package of claim 6, further comprising:
a third semiconductor package;
wherein the third semiconductor package is stacked on the second semiconductor package.

* * * * *